(12) United States Patent
Ishida et al.

(10) Patent No.: US 7,692,257 B2
(45) Date of Patent: Apr. 6, 2010

(54) ULTRASONIC SENSOR COMPRISING A METAL/FERROELECTRIC/METAL/INSULATOR/SEMICONDUCTOR STRUCTURE

(75) Inventors: Makoto Ishida, Toyohashi (JP); Kazuaki Sawada, Toyohashi (JP); Daisuke Akai, Toyohashi (JP); Mikako Yokawa, Toyohashi (JP); Keisuke Hirabayashi, Toyohashi (JP)

(73) Assignee: National University Corporation Toyohashi University of Technology, Toyohashi-shi (JP)

( * ) Notice: Subject to any disclaimer, the term of this patent is extended or adjusted under 35 U.S.C. 154(b) by 0 days.

(21) Appl. No.: 10/549,364

(22) PCT Filed: Mar. 5, 2004

(86) PCT No.: PCT/JP2004/002889
§ 371 (c)(1),
(2), (4) Date: Jul. 17, 2006

(87) PCT Pub. No.: WO2004/084322
PCT Pub. Date: Sep. 30, 2004

(65) Prior Publication Data
US 2006/0278907 A1 Dec. 14, 2006

(30) Foreign Application Priority Data
Mar. 17, 2003 (JP) .............................. 2003-071584

(51) Int. Cl.
*H01L 29/84* (2006.01)
(52) U.S. Cl. .................. 257/416; 257/E29.324
(58) Field of Classification Search .................. 257/213, 257/288, 295, E29.144, E29.272, E27.104, 257/E21.208, E21.436, 414, 415, 416, E29.324
See application file for complete search history.

(56) References Cited

U.S. PATENT DOCUMENTS

| | | | | |
|---|---|---|---|---|
| 4,933,298 A | * | 6/1990 | Hasegawa | 438/150 |
| 5,146,299 A | * | 9/1992 | Lampe et al. | 257/295 |
| 5,354,732 A | * | 10/1994 | Tabata et al. | 505/160 |
| 5,440,173 A | * | 8/1995 | Evans et al. | 257/751 |
| 5,621,839 A | * | 4/1997 | Asano et al. | 385/129 |

(Continued)

FOREIGN PATENT DOCUMENTS

JP    7-55919    3/1995

(Continued)

OTHER PUBLICATIONS

D. Akai et al, Science d Direct, Epitaxial Growth of Pt(001) thin films on Si substrates using an epitaxial γ-Al₂O₃ (001) buffer layer, Journal of Crystal Growth 264 (2004) 463-467.

(Continued)

*Primary Examiner*—Sue Purvis
*Assistant Examiner*—Kevin Quinto
(74) *Attorney, Agent, or Firm*—Oblon, Spivak, McClelland, Maier & Neustadt, L.L.P.

(57) ABSTRACT

A semiconductor element, a semiconductor sensor, and a semiconductor memory element are provided, in which an MFMIS structure having a lower electrode and an integrated circuit can be integrated. An epitaxially grown γ-Al₂O₃ single crystal film (2) is disposed on a semiconductor single crystal substrate (1), and an epitaxial single crystal Pt thin film (3) is disposed on the γ-Al₂O₃ single crystal film (2).

6 Claims, 8 Drawing Sheets

U.S. PATENT DOCUMENTS

| | | | |
|---|---|---|---|
| 6,139,971 A | 10/2000 | Bruchhaus et al. | |
| 6,238,946 B1 * | 5/2001 | Ziegler | 438/50 |
| 6,242,843 B1 * | 6/2001 | Pohjonen et al. | 310/313 R |
| 6,828,160 B2 * | 12/2004 | Liu | 438/3 |
| 2002/0142488 A1 * | 10/2002 | Hong | 438/3 |
| 2002/0155660 A1 * | 10/2002 | Beitel et al. | 438/240 |
| 2004/0021401 A1 * | 2/2004 | Ando | 310/344 |
| 2005/0040516 A1 * | 2/2005 | Sakashita et al. | 257/709 |
| 2005/0179342 A1 * | 8/2005 | Higuchi et al. | 310/324 |

FOREIGN PATENT DOCUMENTS

| | | | |
|---|---|---|---|
| JP | 7-183397 | | 7/1995 |
| JP | 7-298394 | | 11/1995 |
| JP | 9-089651 | | 4/1997 |
| JP | 09-089651 A | * | 4/1997 |
| JP | 2002-110932 | | 4/2002 |
| JP | 2002-151654 | | 5/2002 |
| JP | 2002-289793 | | 10/2002 |
| JP | 2002-299581 | | 10/2002 |
| JP | 2002-299582 | | 10/2002 |

OTHER PUBLICATIONS

D. Akai, Applied Physics Letters 86, 202906 (2005), Ferroelectric properties of sol-gel delivered epitaxial $Pb(Zr_x, Ti_{1-x})O_3$ Thin Films on Si Using Epitaxial $\gamma$-$Al_2O_3$ Layers.

* cited by examiner

F I G. 3

F I G. 4
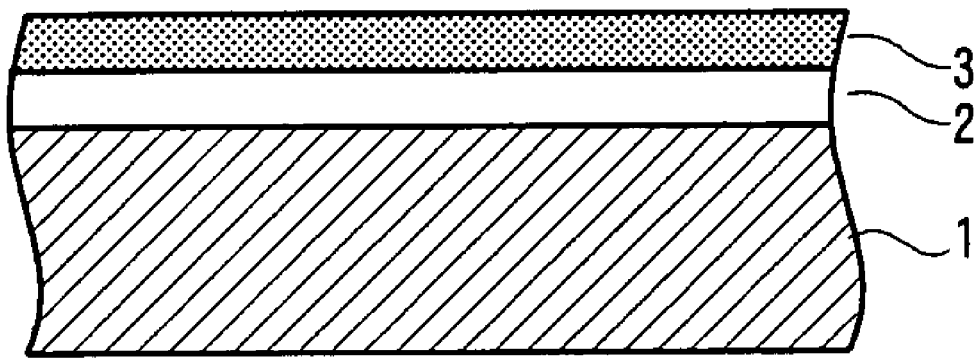

<100>入射

<110>入射

ULTRASONIC SENSOR COMPRISING A METAL/FERROELECTRIC/METAL/INSULATOR/SEMICONDUCTOR STRUCTURE

TECHNICAL FIELD

The present invention relates to a semiconductor element, a semiconductor sensor, and a semiconductor memory element.

BACKGROUND ART

In recent years, various electronic devices taking advantage of properties, e.g., hysteresis, a pyroelectric effect, a piezoelectric effect, and an electrooptical effect, exhibited by a ferroelectric have been researched. Most of all, an application of a device including a Metal/Ferroelectric/Metal/Insulator/Semiconductor (MFMIS) structure to nonvolatile memory elements and sensors is expected.

As for this structure, it is expected that the device performance can be improved and the size can be miniaturized by making the ferroelectric a thin film. Furthermore, it is believed that integration with an integrated circuit can be performed by using a semiconductor substrate.

In the device including the MFMIS structure, an upper electrode and a lower electrode are necessary to derive a signal from the ferroelectric or give a signal to the ferroelectric. For example, in the case where the ferroelectric is used as a sensor, signals appear at the upper and lower electrodes due to a physical effect applied to the ferroelectric. In the case where the ferroelectric is used as a memory element, electric signals must be given from the upper and lower electrodes to the ferroelectric in accordance with the data to be stored.

On the other hand, the crystallinity of the ferroelectric is an important factor that determine the performance of the device. Since the ferroelectric is formed on a metal electrode in the MFMIS structure, the electrode is also required to have good crystallinity. Platinum (Pt) is used widely as a metal material for electrode at present.

In the field of sensor devices, $Pb(Zr,Ti)O_3$ (PZT) base ferroelectric materials are used widely. It is known that the PZT base materials exhibit best ferroelectric properties when the crystal faces on the electrode are made to be (001) faces uniformly. In order to attain the PZT(001), Pt of the lower electrode must be a single crystal in which the (001) faces are aligned, and a single crystal MgO(001) substrate is used at present to attain such Pt. A Pt(111) oriented film and a PZT (111) oriented film thereon can be produced by using a substrate in which a silicon (Si) oxide film is formed on the surface of a silicon (Si) substrate and, thereafter titanium is deposited.

[Patent Document 1]
Japanese Unexamined Patent Application Publication No. 2002-261249 (pages 4 to 5, FIG. 2)

[Non-Patent Document 1]
Akai et al., Extended Abstracts (the 49th Meeting), the Japan Society of Applied Physics and Related Societies, 30a-ZA-6

DISCLOSURE OF INVENTION

As described above, a semiconductor (for example, Si) substrate capable of forming the Pt(001) has been required in order to produce a device in which an MFMIS structure including the PZT(001) exhibiting excellent ferroelectric properties and an integrated circuit are integrated. On the other hand, a currently-used single crystal MgO(001) substrate is an insulating material, and the above-described requirement cannot be satisfied.

Furthermore, the above-described Patent Document 1 discloses a semiconductor memory element characterized by sequentially depositing a highly oriented ferroelectric thin film on a $\gamma$-$Al_2O_3$ single crystal film epitaxially grown on a semiconductor substrate. However, since no lower electrode is disposed in this structure, the semiconductor memory element cannot be used for semiconductor sensors and the like.

In consideration of the above-described circumstances, it is an object of the present invention to provide a semiconductor element, a semiconductor sensor, and a semiconductor memory element, in which an MFMIS structure having a lower electrode and an integrated circuit can be integrated.

In order to achieve the above-described object, the present invention includes the following aspects.

[1] A semiconductor element is characterized by including a $\gamma$-$Al_2O_3$ single crystal film epitaxially grown on a semiconductor single crystal substrate and an epitaxial single crystal Pt thin film disposed on the $\gamma$-$Al_2O_3$ single crystal film.

[2] A semiconductor element is characterized by including a $\gamma$-$Al_2O_3$ single crystal film epitaxially grown on a semiconductor single crystal substrate and an epitaxial single crystal Pt thin film disposed on the $\gamma$-$Al_2O_3$ single crystal film, as well as a highly oriented ferroelectric thin film sequentially deposited on the single crystal Pt thin film.

[3] The semiconductor element according to the above-described item [1] or item [2] is characterized in that a Si single crystal substrate is used as the above-described semiconductor single crystal substrate.

[4] The semiconductor element according to the above-described item [3] is characterized in that the surface of the above-described Si single crystal substrate is a (100) face.

[5] The semiconductor element according to any one of the above-described items [2], [3], and [4] is characterized in that a thin film made of any one of $BaMgF_4$, $Bi_4Ti_3O_{12}$, $(Bi,La)_4Ti_3O_{12}$, $BaTiO_3$, $Ba_xSr_{1-x}TiO_3$, $SrBi_2Ta_2O_9$, $PbTiO_3$, $Pb_yLa_{1-y}Zr_xTi_{1-x}O_3$, and ZnO is used as the above-described ferroelectric thin film.

[6] A semiconductor sensor is characterized by including a $\gamma$-$Al_2O_3$ single crystal film epitaxially grown on a semiconductor single crystal substrate, an epitaxial single crystal Pt thin film disposed on the $\gamma$-$Al_2O_3$ single crystal film, and a highly oriented ferroelectric thin film disposed on the single crystal Pt thin film, as well as an upper electrode disposed on the ferroelectric thin film.

[7] The semiconductor sensor according to the above-described item [6] is characterized in that the above-described semiconductor single crystal substrate has an SOI structure.

[8] The semiconductor sensor according to the above-described item [6] is characterized in that the above-described semiconductor single crystal substrate is subjected to a treatment for adjusting a resonant frequency and an ultrasonic wave is detected.

[9] The semiconductor sensor according to the above-described item [6] is characterized in that the above-described semiconductor single crystal substrate is subjected to etching for isolation of heat and an infrared ray is detected.

[10] The semiconductor sensor according to the above-described item [9] is characterized in that a transistor is integrated in between the above-described upper electrode and a lower electrode made of the above-described epitaxial single crystal Pt thin film.

[11] A semiconductor memory element is characterized by including a memory feature in which the above-described semiconductor single crystal substrate of the semiconductor element according to any one of the above-described items [1] to [5] has an FET structure.

BRIEF DESCRIPTION OF THE DRAWINGS

FIG. 3 is a diagram showing an RHEED pattern of a single crystal γ-Al$_2$O$_3$(001)/Si(001) substrate according to the present invention.

FIG. 4 is a sectional view of a Pt/γ-Al$_2$O$_3$(001)/Si(001) substrate according to an example of the present invention.

BEST MODE FOR CARRYING OUT THE INVENTION

The present invention will be described below.

In the present invention, a single crystal insulating film is grown on a Si substrate and a Pt electrode is formed on the single crystal insulating film. Put another way, the single crystal insulating film is formed in between the Si substrate and the Pt electrode. In this manner, the single crystal Pt electrode can be readily produced, and the MFMIS structure is realized. The insulating film capable of epitaxially growing on the Si substrate is made of γ-Al$_2$O$_3$.

A crystal structure of a material to be laminated and a mismatch factor of lattice constant are important for lamination of a single crystal insulating film. Therefore, lattice constants of γ-Al$_2$O$_3$, Pt, and MgO were studied. Table 1 shows the crystal structures and lattice constants thereof.

TABLE 1

| | Crystal structure | Crystal system | Lattice constant |
|---|---|---|---|
| Pt | face-centered cubic structure | cubic | a = b = c = 3092 Å |
| λ-Al$_2$O$_3$ | spinel structure | tetragonal | a = b = 7.95 Å<br>c = 7.79 Å |
| MgO | spinel structure | cubic | a = b = c = 4.21 Å |

Figure 1:
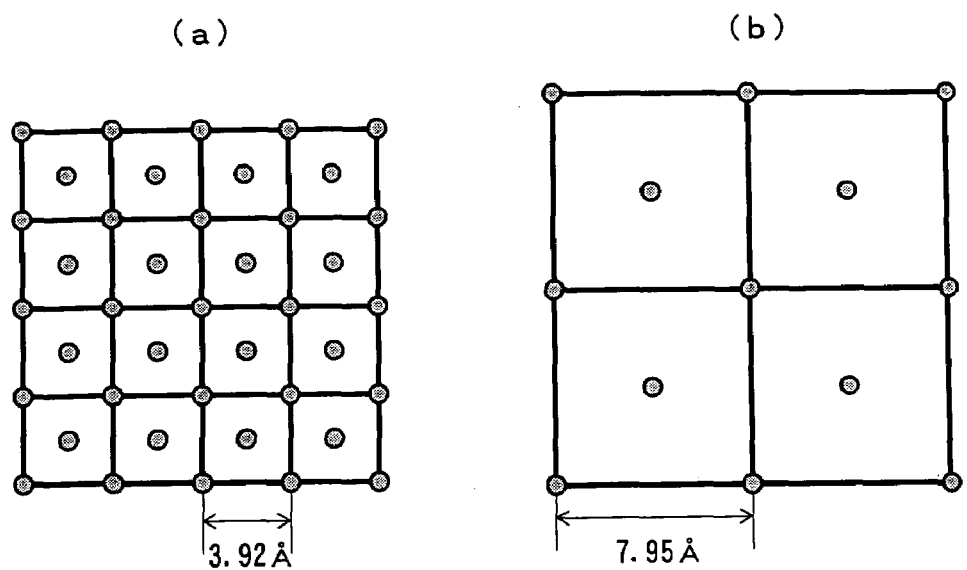
FIG. 1 is a diagram showing an atomic arrangement on a surface in a spinel structure of each of Pt and γ-Al$_2$O$_3$.

FIG. 1 is a diagram showing an atomic arrangement on a surface in a spinel structure of each of Pt and γ-Al$_2$O$_3$. FIG. 1(a) shows the atomic arrangement of Pt, and FIG. 1(b) shows the atomic arrangement of γ-Al$_2$O$_3$.

In the spinel structure, when γ-Al$_2$O$_3$ is taken as an example, the surface can be assumed to be a face-centered cubic structure of Al, as shown in FIG. 1(b). Likewise, in the case of Pt, the surface can also be assumed to be a face-centered cubic structure of Pt, as shown in FIG. 1(a).

Therefore, the atomic arrangements on the (001) faces of Pt and γ-Al$_2$O$_3$ are geometrically equal. When lattice mismatch factors between the Pt(001) face and the γ-Al$_2$O$_3$(001) face and between the Pt(001) face and the MgO(001) face were calculated from the lattice constants shown in Table 1, the values shown in Table 2 were obtained.

TABLE 2

| | Lattice mismatch factor |
|---|---|
| Pt(001)-λ-Al$_2$O$_3$ (001) | 1.4% |
| Pt(001)-MgO (001) | 6.8% |

As is clear from this result, the lattice mismatch factor between Pt and γ-Al$_2$O$_3$ is adequately small, and furthermore, is smaller than the value between Pt and MgO. This indicates the possibility of epitaxial growth of single crystal Pt on γ-Al$_2$O$_3$.

The technology for epitaxially growing a single crystal γ-Al$_2$O$_3$ film on a Si substrate has been made clear in the above-described Patent Document 1 related to the proposal by the inventors of the present invention. The cross-sectional structure of a substrate produced according to this is shown in FIG. 2.

Figure 2:
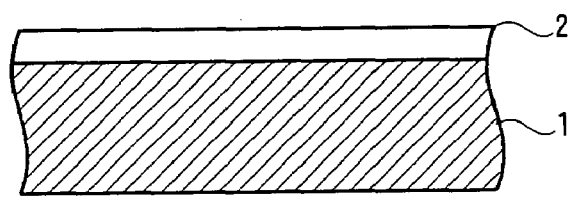
FIG. 2 is a sectional view of a single crystal γ-Al$_2$O$_3$(001)/Si(001) substrate according to the present invention.

FIG. 2 is a sectional view of a single crystal γ-Al$_2$O$_3$ film epitaxially grown on a Si substrate, according to the present invention.

As for this drawing, whether a γ-Al$_2$O$_3$(001) film 2 epitaxially grown on a Si(001) substrate 1 is a single crystal can be determined by observation of a diffraction pattern taken with a reflection high-energy electron diffractograph (RHEED).

FIG. 3 shows an RHEED pattern of a single crystal γ-Al$_2$O$_3$(001)/Si(001) substrate shown in FIG. 2.

As is clear from FIG. 3, the γ-Al$_2$O$_3$(001) film 2 epitaxially grown on the Si(001) substrate 1 is a single crystal. In the present invention, the thus produced γ-Al$_2$O$_3$(001)/Si(001) substrate (hereafter simply referred to as Al$_2$O$_3$ substrate) is used, and a single crystal Pt film is formed by a process described below.

FIG. 4 is a sectional view of a Pt/γ-Al$_2$O$_3$(001)/Si(001) substrate according to an example of the present invention.

In this drawing, reference numeral 3 denotes an epitaxial single crystal Pt thin film. Here, a γ-Al$_2$O$_3$ film 2 (14 nm) epitaxially grown on a Si(001) substrate 1 with a cold-wall CVD apparatus through the use of O$_2$ and TMA (tri-methyl amine) as material gases was used as a substrate. A Pt thin film 3 was produced by an RF sputtering method. The sputtering gas was Ar alone, and the substrate temperature was varied from room temperature up to 600° C. The crystallinity of the resulting Pt thin film 3 was analyzed with the RHEED (refer to FIG. 5 and FIG. 6).

A production process of this Pt/γ-Al$_2$O$_3$(001)/Si(001) substrate will be described.

(1) An Al$_2$O$_3$ substrate made of the γ-Al$_2$O$_3$(001) film 2 grown on the Si(001) substrate 1 is introduced into an RF sputtering apparatus.

(2) The inside of the sputtering apparatus is evacuated with a vacuum pump up to a degree of vacuum within the range of 1×10$^{-2}$ Torr to 1×10$^{-7}$ Torr.

(3) An Ar gas is introduced into the apparatus and, thereby, the degree of vacuum is adjusted within the range of $1\times10^{-0}$ Torr to $1\times10^{-3}$ Torr.

(4) The $Al_2O_3$ substrate is heated to 550° C. or more by a substrate heating mechanism.

(5) Plasma is generated.

(6) After presputtering is conducted, a shutter is opened, and the Pt thin film 3 is deposited on the $Al_2O_3$ substrate.

(7) After a predetermined film thickness is attained, the shutter is closed, and the generation of plasma is terminated.

The crystal structure of the resulting Pt thin film was analyzed through the use of the RHEED. The results thereof are shown in FIG. 5 and FIG. 6.

Figure 5:
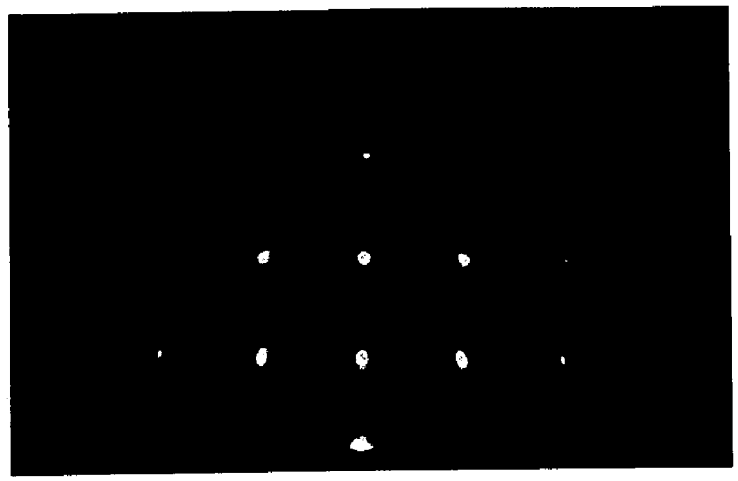
FIG. 5 is a diagram showing an RHEED pattern (No. 1) of a Pt/γ-Al$_2$O$_3$(001)/Si(001) substrate according to an example of the present invention.

In the RHEED pattern shown in FIG. 5, only peaks ascribable to the Pt(002) face were observed and, therefore, it was ascertained that Pt was (001)-oriented. For more details, weak peaks of (111) and (002) were observed when sputtering was conducted at room temperature to 500° C. and, therefore, a polycrystalline Pt thin film was grown. A strong peak of (002) began to appear at 550° C., but a peak of (111) remained slightly. Therefore, epitaxial growth did not occur. In the case of 600° C., the peak of (111) disappeared completely, and only the peak of (002) was observed.

Figure 6:
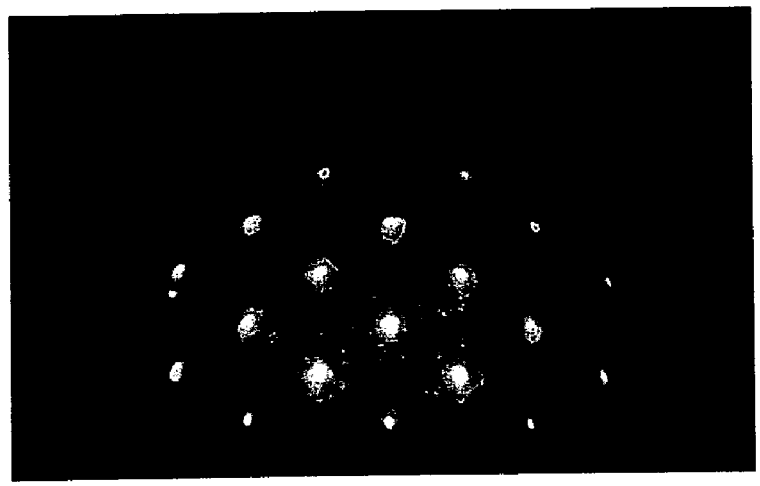
FIG. 6 is a diagram showing an RHEED pattern (No. 2) of a Pt/γ-Al$_2$O$_3$(001)/Si(001) substrate according to an example of the present invention.

A spot pattern was also observed in the RHEED shown in FIG. 6 and, therefore, it was ascertained that the Pt(001) was epitaxially grown on the $\gamma$-$Al_2O_3$(001). In the case where Pt was sputtered on an R face of $\alpha$-$Al_2O_3$ (sapphire) under similar conditions, no (001)-oriented film was attained, but (111) orientation resulted.

Figure 7:
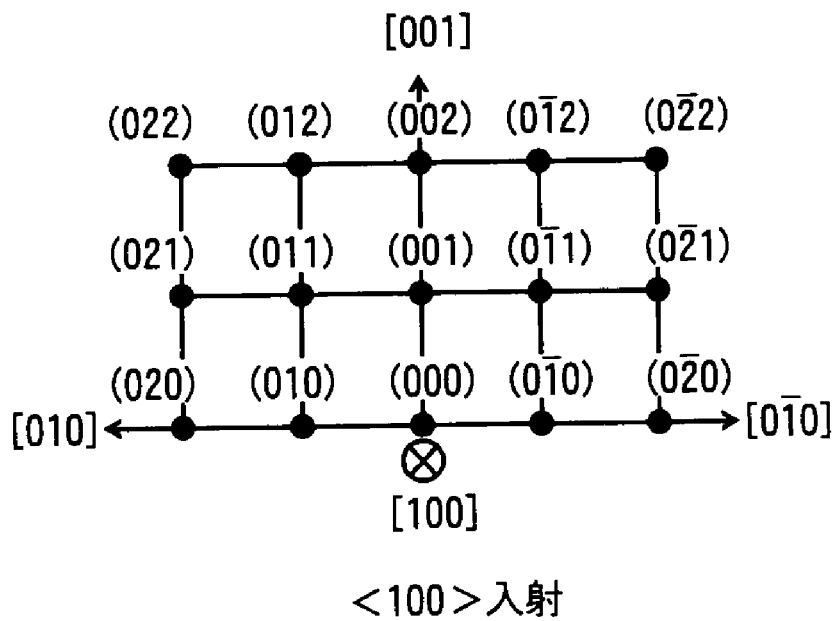
FIG. 7 is a diagram showing identification of spot positions in the RHEED pattern shown in FIG. 6.
Figure 7:
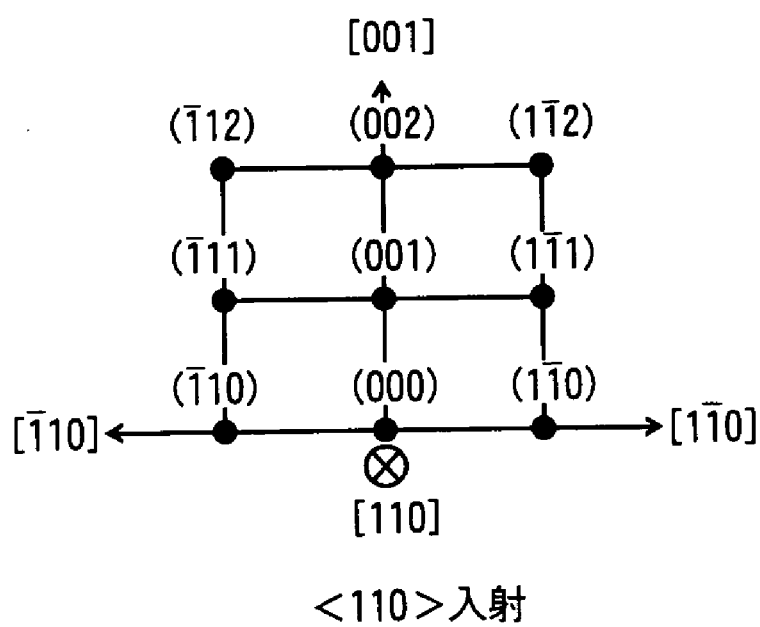

Furthermore, as a result of identification of spot positions and intervals in the RHEED pattern shown in FIG. 6, it was made clear that each spot was ascribable to the face shown in FIG. 7. From these results, it was ascertained that a single crystal Pt(001) was grown on the $Al_2O_3$ substrate.

Figure 8:
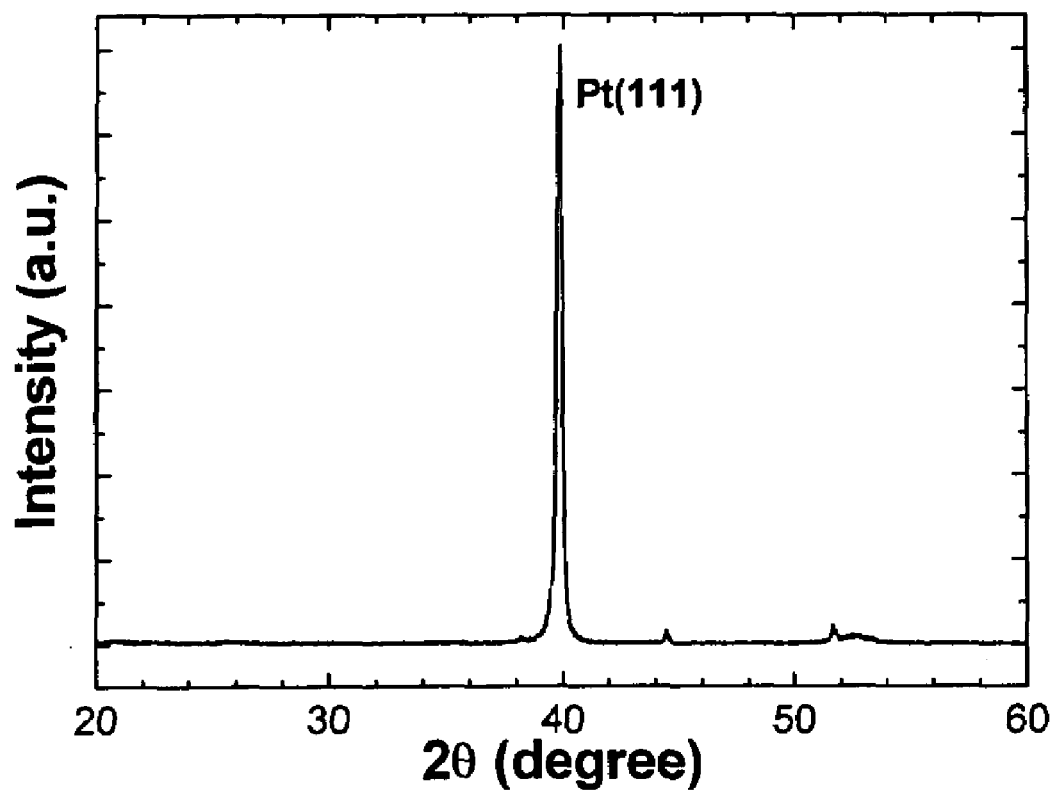
FIG. 8 is a diagram showing an XRD pattern of a Pt/sapphire(10-12)/Si(001) substrate as a comparative example.

In the case where Pt is deposited on a sapphire(10-12) face by using the above-described process, only a (111)-oriented Pt film, as shown in FIG. 8, is attained. Since a single crystal $\gamma$-$Al_2O_3$ is used, a Pt(001) film is attained by using a Si substrate.

The embodiments of the present invention will be described below in detail.

EXAMPLE 1

Configuration Example 1 of Ultrasonic Sensor and Infrared Sensor

Figure 9:
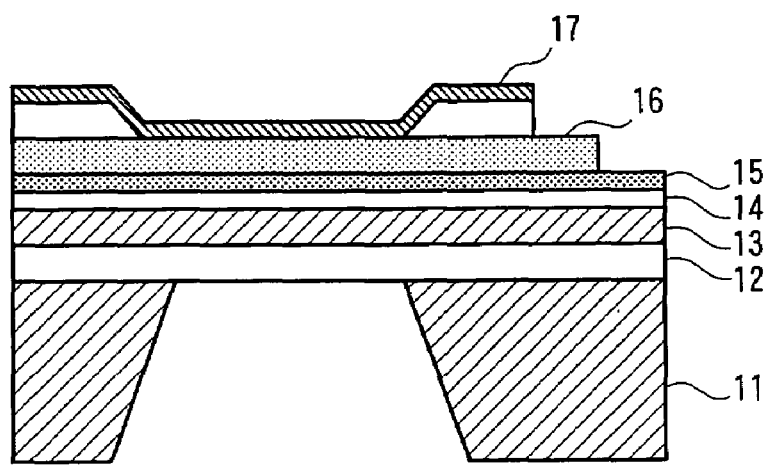
FIG. 9 is a sectional view of an MFMIS type sensor (No. 1) according to an example of the present invention.

FIG. 9 is a configuration sectional view of an MFMIS type sensor produced by using a substrate having the structure of the present invention.

As shown in FIG. 9, a single crystal $\gamma$-$Al_2O_3$(001) film 12 is grown on a Si(001) substrate 11 and, thereafter, a Si single crystal thin film 13 on the order of 5 μm is grown for the purpose of handling. As a matter of course, since this structure is an SOI (Silicon On Insulator) structure, SOI structures produced by other methods may be used.

A single crystal $\gamma$-$Al_2O_3$(001) film 14 is grown on the Si single crystal thin film 13, and a Pt thin film 15 is grown epitaxially. This serves as a lower electrode. Subsequently, a highly-oriented ferroelectric thin film 16 is grown by an MOCVD method, a sol-gel method, or a sputtering method. Thereafter, an upper electrode (for example, gold black) 17 is disposed, and a desired size of ferroelectric thin film 16 is patterned.

In the case where an infrared sensor is constructed from this, in order to effectively cause an increase in heat resulting from application of the infrared ray, the Si substrate 11 is etched from the back with an KOH solution or the like and, thereby, isolation of heat is facilitated. When an infrared ray is incident in between the thus constructed upper electrode 17 and the Pt lower electrode 15, a change in voltage (or a change in current when an ammeter is connected) in accordance with a change in a value of spontaneous polarization (pyroelectric effect) of the ferroelectric thin film 16 is observed at levels commensurate with the amount of the incident infrared ray.

In the case where an ultrasonic sensor is constructed, in order to adjust the resonant frequency, the Si substrate 11 is cut similarly from the back. When an ultrasonic wave is incident in between the thus constructed upper electrode 17 and the Pt lower electrode 15, a voltage is generated due to a piezoelectric effect.

Figure 10:
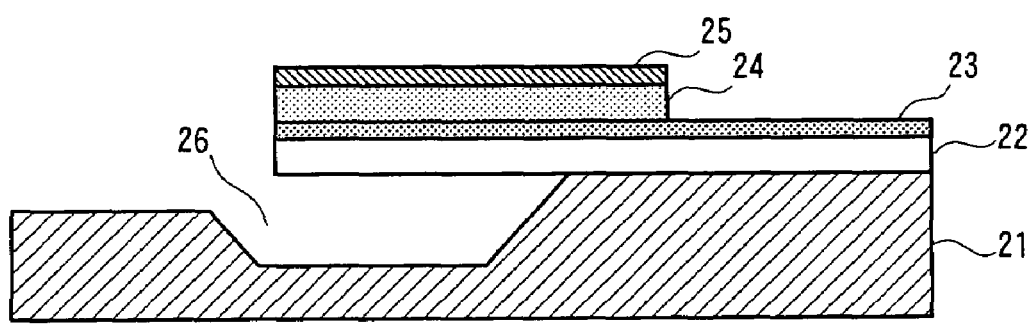
FIG. 10 is a sectional view of an MFMIS type sensor (No. 2) according to an example of the present invention.

An MFMIS type sensor having a similar function can also be attained by a structure shown in FIG. 10.

That is, a single crystal $\gamma$-$Al_2O_3$(001) film 22, a single crystal Pt lower electrode 23, a ferroelectric thin film 24, and an upper electrode 25 are formed on a Si substrate 21. A recess 26 is formed on a part of the Si substrate 21 and the single crystal $\gamma$-$Al_2O_3$(001) film 22 and, thereby, an overhanging state is brought about. That is, in this case, the etching of the Si substrate 21 for isolation of heat or adjustment of the resonant frequency is conducted from the right side of the Si substrate 21.

Figure 11:
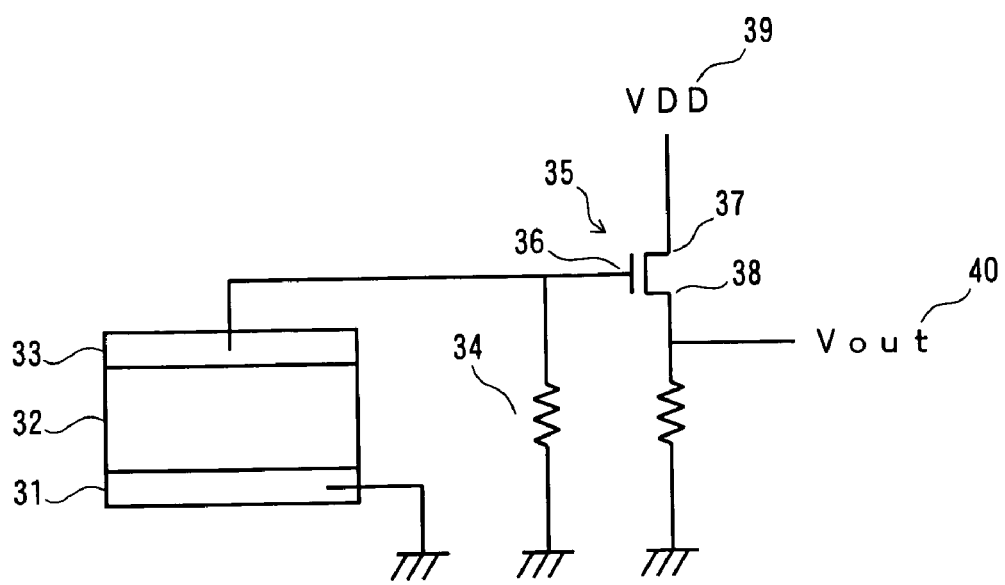
FIG. 11 is a configuration diagram of an MFMIS type semiconductor sensor integrated with a transistor, according to an example of the present invention.

FIG. 11 is a configuration diagram of an MFMIS type semiconductor sensor integrated with a transistor, according to an example of the present invention.

In this drawing, reference numeral 31 denotes a lower electrode (epitaxial single crystal Pt film), reference numeral 32 denotes a ferroelectric thin film, reference numeral 33 denotes an upper electrode, reference numeral 34 denotes a resistance, reference numeral 35 denotes a field-effect transistor, reference numeral 36 denotes a gate, reference numerals 37 and 38 denote source-drains, reference numeral 39 denotes a power supply voltage (VDD) terminal, and reference numeral 40 denotes a sensor output (Vout) terminal.

As described above, the charge generated due to the pyroelectric effect resulting from the application of infrared ray is converted into a change in voltage with the field-effect transistor (or MOS transistor) 35, as shown in FIG. 11, and the signal is derived. Consequently, noises can be reduced. The resistance 34 in the drawing is referred to as a shunt resistance. The current is converted into the voltage, and the speed of response to the infrared ray is controlled.

Figure 12:
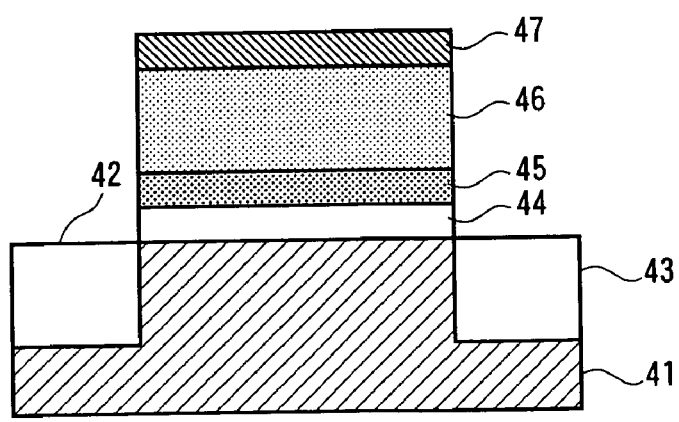
FIG. 12 is a sectional view of an MFMIS type semiconductor memory element including a memory structure, according to an example of the present invention.

FIG. 12 is a sectional view of an MFMIS-FET type semiconductor memory element including a memory structure according to an example of the present invention.

In this drawing, reference numeral 41 denotes a semiconductor substrate [Si substrate], reference numerals 42 and 43 denote source-drains, reference numeral 44 denotes an insulating film [epitaxial single crystal $\gamma$-$Al_2O_3$(001) film], reference numeral 45 denotes a lower electrode (epitaxial single crystal Pt film), reference numeral 46 denotes a ferroelectric thin film, and reference numeral 47 denotes an upper electrode.

This is a semiconductor structure in which the insulating film (epitaxial single crystal $\gamma$-$Al_2O_3$ film) 44 is disposed between the source-drains 42 and 43, a metal (epitaxial single crystal Pt film) 45 serving as a lower electrode is disposed thereon, the ferroelectric thin film 46 is disposed thereon, and the upper electrode 47 is disposed.

When a voltage of a certain value or more (for example, 5 V) is applied to the upper electrode 47, a current flows between the source-drains 42 and 43. Even when the voltage of the upper electrode is reduced to 0 V, the current keeps on flowing due to the hysteresis of the ferroelectric 46. Subsequently, when a voltage less than or equal to a certain negative value (for example, −5 V) is applied to the upper electrode 47, the current stops flowing. Even when the voltage of the upper electrode 47 is returned to 0 V, no current flows due to the hysteresis of the ferroelectric 46.

A thin film made of any one of $BaMgF_4$, $Bi_4Ti_3O_{12}$, $(Bi,La)_4Ti_3O_{12}$, $BaTiO_3$, $Ba_xSr_{1-x}TiO_3$, $SrBi_2Ta_2O_9$, $PbTiO_3$, $Pb_yLa_{1-y}Zr_xTi_{1-x}O_3$, and ZnO may be used as the ferroelectric thin film.

The present invention is not limited to the above-described example. Various modifications can be made based on the purport of the present invention, and these are included within the scope of the present invention.

As described above in detail, the following effects can be exerted according to the present invention.

(A) A single crystal $\gamma$-$Al_2O_3$ film (single crystal insulating thin film) is grown on a semiconductor substrate and the single crystal $\gamma$-$Al_2O_3$ film is formed in between the semiconductor substrate and a Pt electrode. Consequently, a single crystal Pt electrode can readily be produced, and the MFMIS structure can readily be produced.

(B) Devices taking advantage of ferroelectric thin films, most of all, semiconductor memory elements and semiconductor sensors, can be attained, and the improvement of performance thereof and the miniaturization in size can be facilitated.

INDUSTRIAL APPLICABILITY

The semiconductor element, the semiconductor sensor, and the semiconductor memory element of the present invention are suitable for, in particular, infrared and semiconductor memory.

The invention claimed is:
1. An ultrasonic sensor comprising:
    a semiconductor single crystal substrate having a recess formed on a part of an upper surface thereof;
    a $\gamma$-$Al_2O_3$ single crystal film epitaxially grown on the semiconductor single crystal substrate;
    an epitaxial single crystal Pt thin film disposed on the $\gamma$-$Al_2O_3$ single crystal film;
    a highly oriented ferroelectric thin film disposed on the epitaxial single crystal Pt thin film; and
    an upper electrode disposed on the ferroelectric thin film; wherein
    the $\gamma$-$Al_2O_3$ single crystal film overhangs the recess formed on a part of the upper surface of the semiconductor single crystal substrate;
    the semiconductor single crystal substrate etched from the upper surface thereof to adjust a resonant frequency and detect an ultrasonic wave.
2. The ultrasonic sensor according to claim 1, wherein the semiconductor single crystal substrate has an SOI structure.
3. The ultrasonic sensor according to claim 1 wherein the highly oriented ferroelectric thin film disposed on the epitaxial single crystal Pt thin film comprises one selected from the group consisting of $BaMgF_4$, $Bi_4Ti_3O_{12}$, $(Bi,La)_4Ti_3O_{12}$, $BaTiO_3$, $Ba_xSr_{1-x}TiO_3$, $SrBi_2Ta_2O_9$, $PbTiO_3$, $Pb_yLa_{1-y}Zr_xTi_{1-x}O_3$, and ZnO.
4. The ultrasonic sensor according to claim 1 wherein the upper electrode disposed on the ferroelectric thin film comprises gold black.
5. The ultrasonic sensor according to claim 1, wherein the semiconductor single crystal substrate is a Si single crystal.
6. The ultrasonic sensor according to claim 5, wherein the $\gamma$-$Al_2O_3$ single crystal film epitaxially grown on a semiconductor single crystal substrate is grown on a (100) face of the Si single crystal.

\* \* \* \* \*